United States Patent

Kawai

(10) Patent No.: US 12,490,474 B2
(45) Date of Patent: Dec. 2, 2025

(54) SEMICONDUCTOR DEVICE AND SEMICONDUCTOR MEMORY DEVICE

(71) Applicant: Kioxia Corporation, Tokyo (JP)

(72) Inventor: Hiroki Kawai, Aichi (JP)

(73) Assignee: Kioxia Corporation, Tokyo (JP)

( * ) Notice: Subject to any disclaimer, the term of this patent is extended or adjusted under 35 U.S.C. 154(b) by 466 days.

(21) Appl. No.: 18/177,751

(22) Filed: Mar. 2, 2023

(65) Prior Publication Data

US 2023/0411530 A1 Dec. 21, 2023

(30) Foreign Application Priority Data

Jun. 21, 2022 (JP) ................................. 2022-099458

(51) Int. Cl.
*H10D 30/67* (2025.01)
*H01L 23/528* (2006.01)
*H10B 12/00* (2023.01)

(52) U.S. Cl.
CPC ..... *H10D 30/6756* (2025.01); *H01L 23/5283* (2013.01); *H10B 12/30* (2023.02); *H10D 30/6735* (2025.01)

(58) Field of Classification Search
CPC .......... H10D 30/6756; H10D 30/6735; H10D 30/6728; H10D 30/6755; H10D 86/423; H10D 86/481; H10D 86/60; H01L 23/5283; H10B 12/30; H10B 12/033; H10B 12/05
See application file for complete search history.

(56) References Cited

U.S. PATENT DOCUMENTS

| | | | |
|---|---|---|---|
| 8,664,097 B2 | 3/2014 | Jintyou | |
| 9,685,560 B2 | 6/2017 | Yamazaki | |
| 9,698,272 B1* | 7/2017 | Ikeda | ............. H10D 86/481 |
| 2012/0104381 A1* | 5/2012 | Shieh | ............ H10D 30/6755 |
| | | | 257/43 |
| 2013/0069055 A1* | 3/2013 | Yamazaki | ......... H10D 30/6729 |
| | | | 257/43 |
| 2015/0279913 A1 | 10/2015 | Gates | |
| 2018/0331314 A1 | 11/2018 | Niboshi | |
| 2019/0296155 A1* | 9/2019 | Sawabe | ............. H10B 12/31 |
| 2022/0068925 A1 | 3/2022 | Kawai | |
| 2022/0085182 A1* | 3/2022 | Kataoka | ............. H10D 64/517 |
| 2022/0302120 A1 | 9/2022 | Sato | |

FOREIGN PATENT DOCUMENTS

| | | |
|---|---|---|
| JP | 2020115556 A | 7/2020 |
| WO | 2017082216 A1 | 5/2017 |

OTHER PUBLICATIONS

Jimmy Melskens et al., "Passivating Contacts for Crystalline Silicon Solar Cells: From Concepts and Materials to Prospects", IEEE Journal of Photovoltaics, vol. 8, No. 2, Mar. 2018, pp. 373-388.

(Continued)

*Primary Examiner* — Syed I Gheyas
(74) *Attorney, Agent, or Firm* — Kim & Stewart LLP

(57) ABSTRACT

According to one embodiment, a semiconductor device includes an oxide semiconductor layer, an oxide conductor layer disposed on the oxide semiconductor layer, a first oxide layer disposed on the oxide conductor layer and comprising vanadium oxide, and a metal wiring layer disposed on the first oxide layer.

20 Claims, 11 Drawing Sheets

(56) References Cited

OTHER PUBLICATIONS

Arun Kuruvila et al., "Organic light emitting diodes with environmentally and thermally stable doped graphene electrodes", Journal of Materials Chemistry C, 2, 2014, p. 6940, DOI: 10.1039/c4tc01224k.
Kaijian Xing et al., "High-electron-affinity oxide V2O5 enhances surface transfer doping on hydrogen-terminated diamond", Diamond & Related Materials 108, 107865, 2020, pp. 1-7, https://doi.org/10.1016/j.diamond.2020.107865.
David R. Lide, "CRC Handbook of Chemistry and Physics", Internet Version 2005, CRC Press, Boca Raton, FL, U.S.A. 2005, http://www.hbcpnetbase.com.

\* cited by examiner

SEMICONDUCTOR DEVICE AND SEMICONDUCTOR MEMORY DEVICE

CROSS-REFERENCE TO RELATED APPLICATION(S)

This application is based upon and claims the benefit of priority from Japanese Patent Application No. 2022-099458, filed Jun. 21, 2022, the entire contents of which are incorporated herein by reference.

FIELD

Embodiments described herein relate generally to a semiconductor device and a semiconductor memory device.

BACKGROUND

An oxide semiconductor transistor having a channel region comprising an oxide semiconductor material that is a metal oxide of at least one or more metal element such as indium (In), tin (Sn), zinc (Zn), and/or gallium (Ga) has beneficial properties such as low channel leakage current. However, such an oxide semiconductor transistor has a disadvantage that oxygen will be extracted from the oxide semiconductor in a reduction reaction with surrounding or adjacent metal wires at elevated temperatures. A loss of oxygen from the oxide semiconductor may adversely affect transistor operation given the small size of the transistors. Therefore, prevention of extraction of oxygen from the oxide semiconductor is desirable.

DETAILED DESCRIPTION

Embodiments provide a semiconductor device and a semiconductor memory device capable of reducing the deterioration in properties related to extraction of oxygen from an oxide semiconductor.

In general, according to one embodiment, a semiconductor device includes an oxide semiconductor layer, an oxide conductor layer disposed on the oxide semiconductor layer, a first oxide layer disposed on the oxide conductor layer and comprising vanadium oxide, and a metal wiring layer disposed on the first oxide layer.

Hereinafter, a semiconductor device and a semiconductor memory device according to certain example embodiments will be described with reference to the drawings. In described example embodiments, those components which are the substantially same embodiment to embodiment are denoted with the same reference symbols and description thereof may be omitted from subsequently described embodiments or examples. The drawings are schematic, and depicted relationships between thicknesses and planar sizes and the like may be different from those of actually implemented embodiments.

First Embodiment

Figure 1:
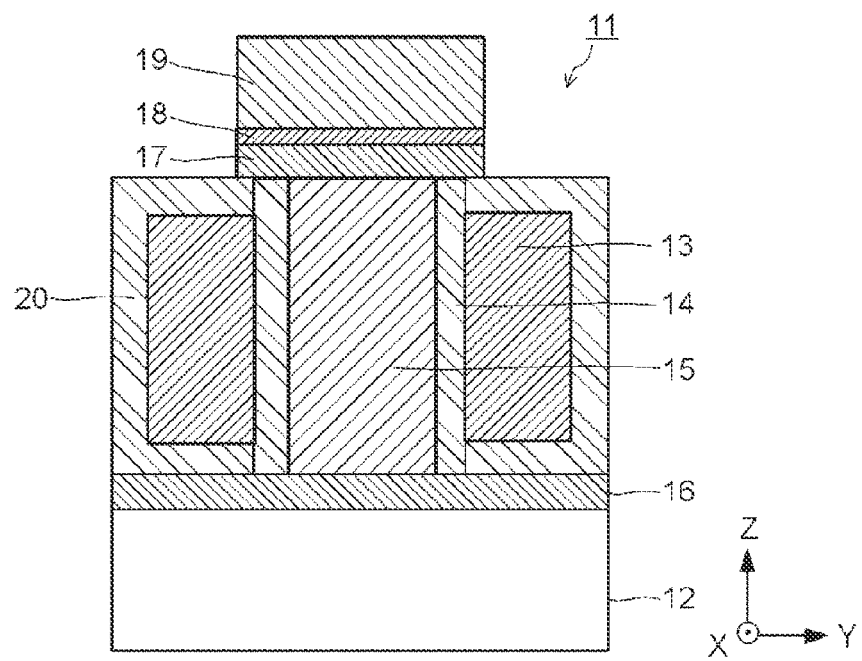
FIG. 1 is a cross-sectional view of a semiconductor device according to a first embodiment.

FIG. 1 illustrates a transistor 11 that is a semiconductor device according to a first embodiment. The transistor 11 is a vertical transistor, or a so-called surrounding gate transistor (SGT) in which a gate electrode surrounds a channel layer. The transistor 11 illustrated in FIG. 1 includes a substrate 12, a gate electrode 13 (a first electrode), a gate insulating film 14, an oxide semiconductor layer 15 as a channel layer, a source electrode 16 (a second electrode), a drain electrode 17 (a third electrode) including an oxide conductor layer, a first oxide layer 18, and a metal wiring layer 19.

In the transistor 11 illustrated in FIG. 1, the source electrode 16 is disposed on the substrate 12, which may be a semiconductor substrate. The oxide semiconductor layer 15 is disposed on the source electrode 16 and extends in the Z direction. The oxide semiconductor layer 15 is, for example, cylindrical. The bottom of the oxide semiconductor layer 15 is electrically connected to the source electrode 16. The gate insulating film 14 is disposed along the outer circumferential surface of the oxide semiconductor layer 15. The gate electrode 13 is disposed within the gate insulating film 14 so as to cover (surround) the outer circumferential surface of the oxide semiconductor layer 15. The drain electrode 17 is electrically connected to the upper end of the oxide semiconductor layer 15.

The first oxide layer 18 is disposed on the drain electrode 17. The metal wiring layer 19 is disposed on the first oxide layer 18. The first oxide layer 18 acts as an oxygen barrier layer that reduces the extraction of oxygen from the oxide semiconductor layer 15 to the metal wiring layer 19. The first oxide layer 18 comprises a vanadium oxide ($VO_x$). An interlayer insulating film 20 is disposed around the outer periphery of the gate electrode 13. Instead of the solid cylindrical oxide semiconductor layer 15 depicted in FIG. 1, a hollow cylindrical oxide semiconductor layer 15 may be adopted. The hollow cylindrical layer may have a bottom portion covering the source electrode 16. In such a structure, the inside of the hollow cylindrical oxide semiconductor layer 15 can be filled with an insulating material such as silicon oxide. The oxide semiconductor layer 15 may extend in the Z direction between the source electrode 16 and the drain electrode 17, that is, in the vertical direction (Z direction in FIG. 1) of the transistor 11. This structure constitutes a vertical transistor.

For the oxide semiconductor layer 15, oxides exhibiting various types of semiconductor properties may be used and the oxide semiconductor layer 15 is not otherwise particularly limited. Examples of the oxide used for the oxide semiconductor layer 15 include, but are not limited to, a metal oxide (ME1-ME2-containing at least one first metal element ("ME1 element") selected from the group consisting of indium (In) and tin (Sn), and at least one second metal element ("ME2 element") selected from the group consisting of zinc (Zn), gallium (Ga), aluminum (Al), tungsten (W), and silicon (Si). Typical examples of such an oxide semiconductor include In—Ga—Zn—O (IGZO) and In—Zn—O (IZO).

For the drain electrode 17, an oxide conductor (conductive oxide material) layer is used. For the source electrode 16, an oxide conductor layer is preferably used, but the source electrode 16 is not limited to an oxide conductor layer. Examples of a material for the oxide conductor layer adopted for the drain electrode 17 and the source electrode 16 include, but are not limited to, indium oxide ($In_2O_3$), tin oxide ($SnO_2$), indium-tin oxide ($InSnO_x$; "ITO"), zinc oxide (ZnO), aluminum-doped zinc oxide (ZnO:Al; "AZO"), gallium-doped zinc oxide (ZnO:Ga; "GZO"), indium-doped zinc oxide (ZnO:In; "IZO"), silicon-doped zinc oxide (ZnO:Si; "SZO"), fluorine-doped zinc oxide (ZnO:F; "FZO"), antimony-doped tin oxide ($SnO_2$:Sb; "ATO"), fluorine-doped tin oxide ($SnO_2$:F; "FTO"), and niobium-doped titanium oxide ($TiO_2$:Nb; "TNO").

For the metal wiring layer 19, tungsten (W), molybdenum (Mo), titanium (Ti), an alloy of tungsten, molybdenum, and/or titanium (a W alloy, a Mo alloy, or a Ti alloy), or the like can be used, but the material for metal wiring layer 19 is not limited to these examples.

The gate electrode 13 comprises a metal, a metal compound, a conductive oxide, a semiconductor material, or the like. The gate electrode 13 may comprise, for example, at least one element selected from tungsten (W), molybdenum (Mo), copper (Cu), tantalum (Ta), aluminum (Al), and the like. The gate electrode 13 may comprise an aluminum alloy containing aluminum as a main component. The gate electrode 13 may comprise titanium nitride (TiN), tantalum nitride (TaN), or the like.

The gate insulating film 14 may comprise silicon oxide (SiO), silicon nitride (SiN), or the like.

Figure 2:
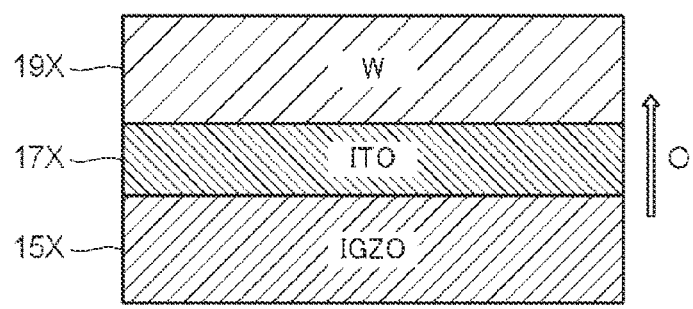
FIG. 2 is a cross-sectional view of a part of a semiconductor device according to a comparative example.

In a structure in which a metal wiring layer 19X is tungsten (W) disposed directly on a drain electrode 17X is "ITO" disposed on an oxide semiconductor layer 15X, which is "IGZO," as illustrated in FIG. 2, the metal wiring layer 19X is likely to be oxidized during a high-temperature process found in the manufacturing process for producing a semiconductor device or the like. Therefore, the tungsten metal wiring layer 19X captures oxygen from the IGZO oxide semiconductor layer 15X which migrates through the ITO drain electrode 17X. The drain electrode 17X itself does not capture oxygen from the oxide semiconductor layer but oxygen easily passes (migrates) through the ITO drain electrode 17X. Therefore, the tungsten metal (metal wiring layer 19X) acquires oxygen from the IGZO material (oxide semiconductor layer 15X) migrating via the ITO material (drain electrode 17X). At an interface region between the IGZO (oxide semiconductor layer and the ITO (drain electrode 17X), an oxygen vacancy region (oxygen deficient region) is generated by the migration of oxygen from the IGZO (oxide semiconductor layer 15X). The generation of the oxygen vacancy region (which is a low resistance region) causes deterioration in properties of the IGZO (oxide semiconductor layer 15X) that deteriorates properties of the transistor 11 or the like.

Figure 3:
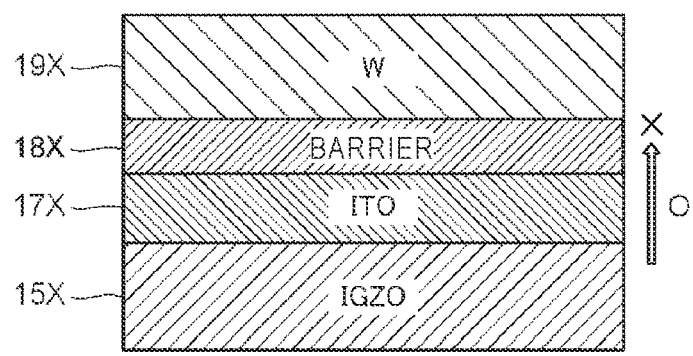
FIG. 3 is an enlarged cross-sectional view of a part of a semiconductor device according to a first embodiment.

As a countermeasure for the aforementioned issue, the tungsten metal wiring layer 19X can be oxidized in advance to limit oxygen vacancy generation in the IGZO material (oxide semiconductor layer 15X). When the tungsten metal wiring layer 19X is only partially or lightly oxidized in an oxygen-containing atmosphere where the oxygen level is low, absorption of oxygen from the IGZO (oxide semiconductor layer 15X) cannot be sufficiently reduced. In contrast, when the tungsten metal wiring layer 19X is heavily or strongly oxidized, the absorption of oxygen from the IGZO 15X can be reduced. However, the electric resistance of the $WO_x$ material obtained by a strong oxidation is high, and the properties of the tungsten (metal wiring layer 19X) are deteriorated. It is considered that a barrier film 18X that reduces the absorption (trapping) of oxygen from the IGZO material (oxide semiconductor layer 15X) can be disposed between the ITO (drain electrode 17X) and the tungsten (metal wiring layer 19X), as illustrated in FIG. 3. A barrier film 18X material that reduces extraction of oxygen from the IGZO is required.

For example, disposition of a barrier film 18X comprising a titanium oxide ($TiO_x$) film or the like between the ITO (drain electrode 17X) and the W (metal wiring layer 19X) can be considered. However, a $TiO_x$ material has a high electric resistance much like tungsten oxide ($WO_x$) material, and thus the properties of the transistor may still be deteriorated. Therefore, as a constituent material for the barrier film 18X disposed between the ITO (or other oxide conductor layer (drain electrode 17X)) and the tungsten (metal wiring layer 19X), a metal that is easily oxidized (oxygen is easily scavenged (trapped)) and can prevent oxygen from the IGZO (oxide semiconductor layer 15X) being captured due to oxidation of the tungsten (metal wiring layer 19X) is preferably used, and the oxide of such a metal preferably low in electric resistance.

Figure 4A:
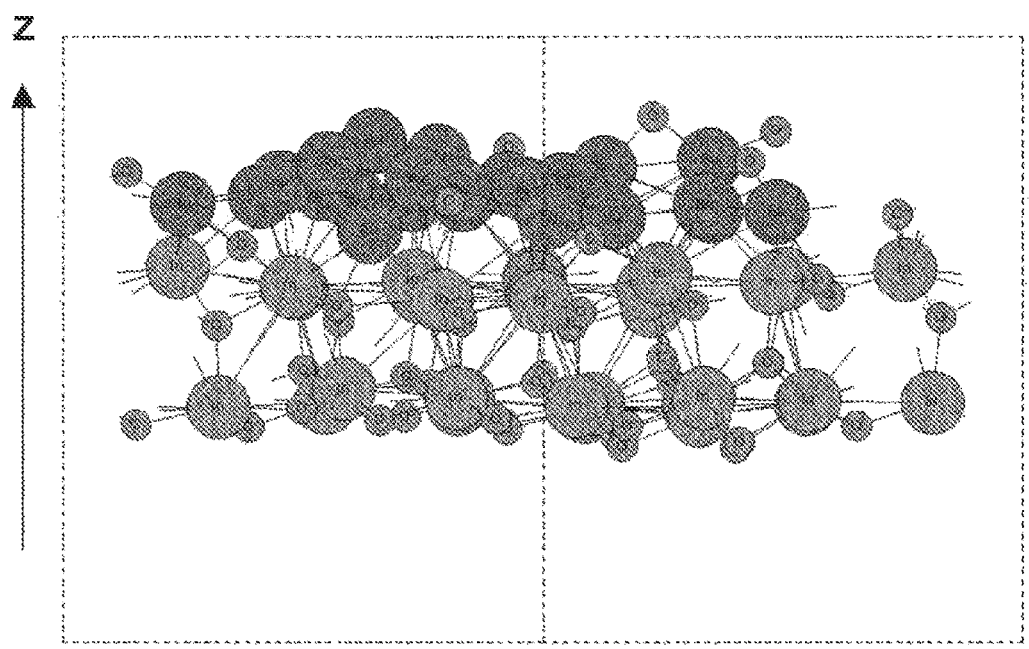
FIGS. 4A and 4B are views related to oxygen scavenging capacity of various types of metals.
Figure 4B:
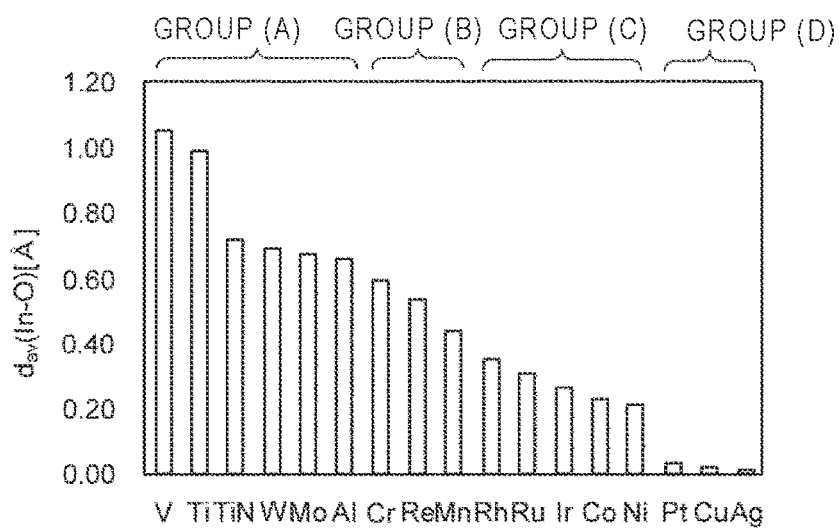

FIGS. 4A and 4B relate to a value determination of an indication ($d_{av}$(In—O)) of oxygen scavenging capacity for various types of metals disposed on $In_2O_3$ ([111] orientation). The indication ($d_{av}$(In—O)) of oxygen scavenging capacity is a value obtained by evaluation after annealing a stacked film of In—O and a metal oxide at 500 K. The value of ($d_{av}$(In—O)) is based on the following Expression (1) from an average coordinate ($z_{av}$(In)) of indium (In) in a z direction and an average coordinate ($z_{av}$(O)) of oxygen (O) in the z direction as depicted in FIG. 4A for example. This value corresponds to oxygen scavenging capacity.

$$d_{av}(\text{In—O}) = z_{av}(\text{O}) - z_{av}(\text{In}) \qquad \text{Expression (1):}$$

In FIG. 4B, the metals are divided into four groups: group (A), (B), (C), and (D) based on the size of the indication ($d_{av}$(In—O)) value.

Figure 5:
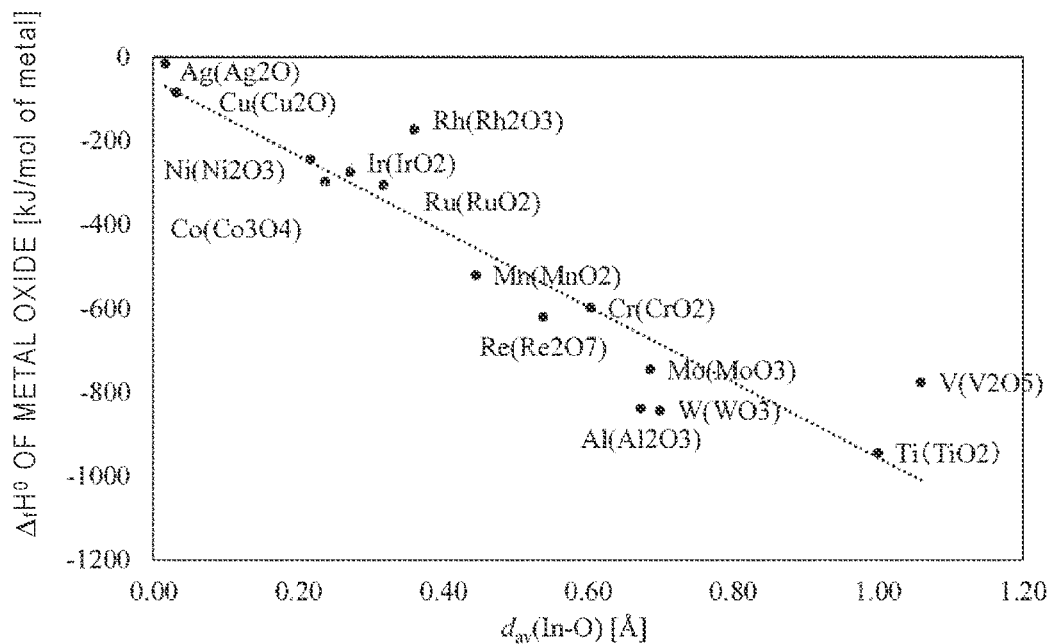
FIG. 5 is a view illustrating a relationship between an indicator of oxygen scavenging capacity of various types of metals and values for standard enthalpy of formation of oxides of those metals.

FIG. 5 illustrates a relationship between the indication ($d_{av}$(In—O)) value of certain metals and values ($\Delta_f H^\circ$) of standard enthalpy of formation of oxides of these metals. As illustrated in FIG. 5, the values ($\Delta_f H^\circ$) of standard enthalpy of formation of oxides of the metals correlate with the indication ($d_{av}$(In—O)) value (oxygen scavenging capacity) of the metals. This relationship shows that the indication ($d_{av}$(In—O)) value relates to the ease of trapping oxygen. Therefore, it is preferable that a metal selected from the group (A) in FIG. 4B having large oxygen scavenging capacity be adopted for the barrier film between the drain electrode 17 (oxide conductor layer) and the metal wiring layer 19 when formed of tungsten or the like. It is also preferable that the barrier metal form an oxide with low electric resistance.

Figure 6A:
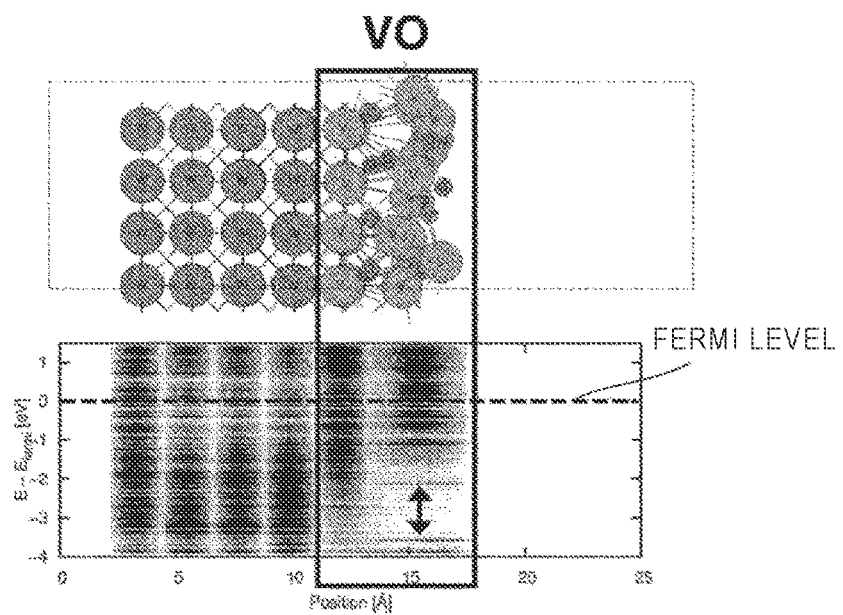
FIGS. 6A and 6B are views illustrating an electronic state of a stacked model of vanadium oxides (VO and $V_2O_3$) and tungsten.
Figure 6B:
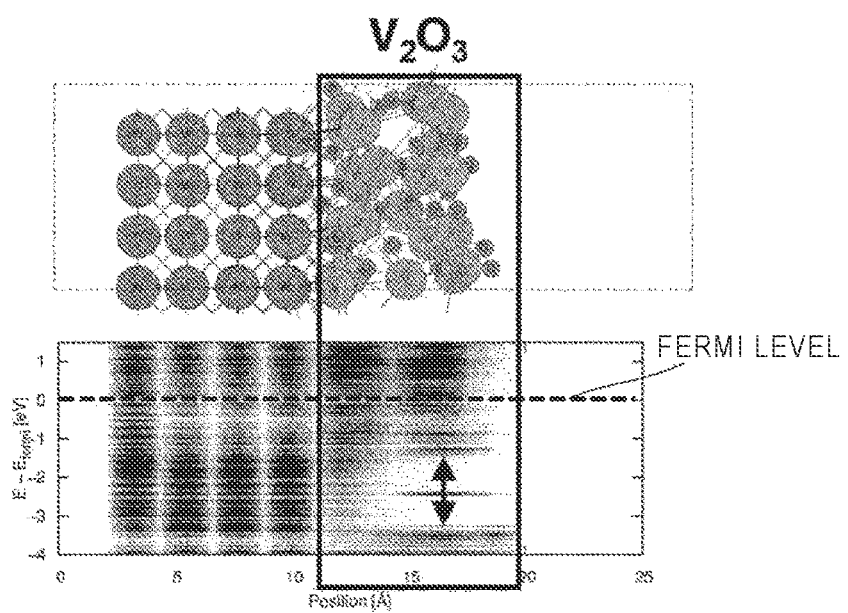
Figure 7A:
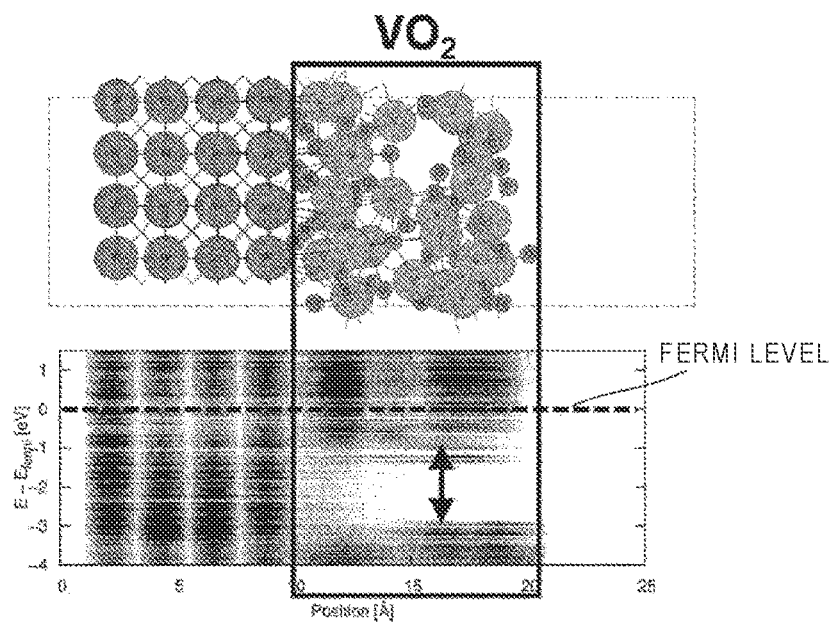
FIGS. 7A and 7B are views illustrating an electronic state of a stacked model of vanadium oxides ($VO_2$ and $V_2O_5$) and tungsten.
Figure 7B:
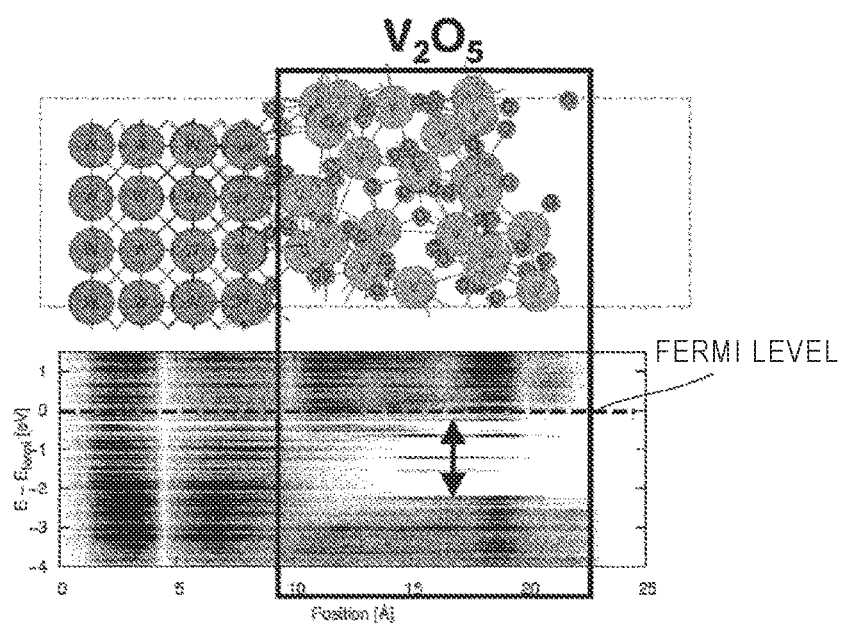

FIGS. 6A, 6B, 7A, and 7B illustrate electronic states of stacked models of tungsten ([110] orientation) and vanadium oxide ($VO_x$) (for x=1.0, 1.5, 2.0, and 2.5). FIG. 6A illustrates the electronic state of the stacked model of tungsten and VO (that is, x=1.0). FIG. 6B illustrates the electronic state of the stacked model of tungsten and $V_2O_3$ (that is, x=1.5). FIG. 7A illustrates the electronic state of the stacked model of tungsten and $VO_2$ (that is, x=2.0). FIG. 7B illustrates the electronic state of the stacked model of tungsten and $V_2O_5$ (that is, x=2.5). As illustrated in FIGS. 6A, 6B, 7A, and 7B, when the oxygen in $VO_x$ is highly concentrated, the band gap is opened, and the bottom end of a conduction band thereof approaches a Fermi level of tungsten. However, an energy at the bottom end of the conduction band is not higher than the Fermi level, and $VO_x$ does not function as a tunnel barrier with respect to electrons of tungsten. This is due to properties such as high electron affinity of $VO_x$. For example, since the electron affinity of $V_2O_5$ is about 7 eV or less, $V_2O_5$ does not function as a tunnel barrier with respect to the electrons or does not contribute to an increase in on-resistance of the transistor 11.

Figure 8A:
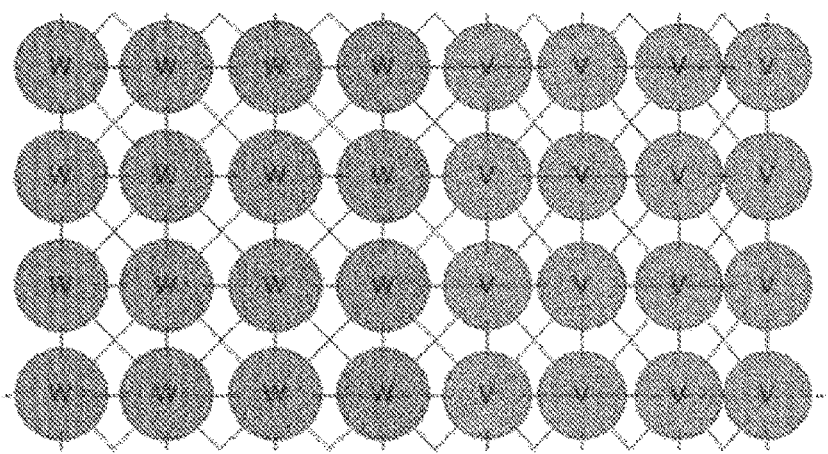
FIGS. 8A and 8B are views related to oxygen scavenging resistance in tungsten and vanadium.
Figure 8B:
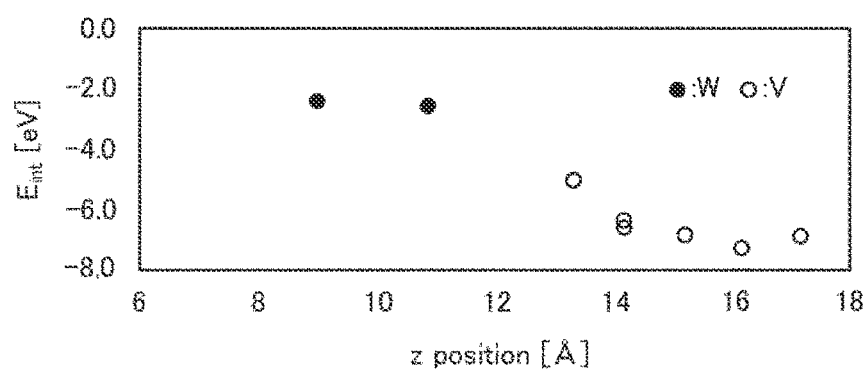

FIGS. 8A and 8B illustrate aspects related to an interaction energy ($E_{int}$) of oxygen in tungsten and in vanadium that correspond to oxygen scavenging resistance. FIG. 8A illustrates a state in which tungsten and vanadium with body-centered cubic (BCC) structures are cut along a stable (110) plane and stacked. FIG. 8B illustrates $E_{int}$s in tungsten and vanadium when the oxygen exists as an oxygen radical such that interstitial oxygen exists at random positions of the tungsten and vanadium. As illustrated in FIG. 8B, the maximum absolute value of $E_{int}$ in tungsten is 2.4 eV, and the maximum absolute value of $E_{int}$ in vanadium is 7.3 eV. This shows that oxygen in vanadium is more stable than oxygen in tungsten.

Figure 9A:
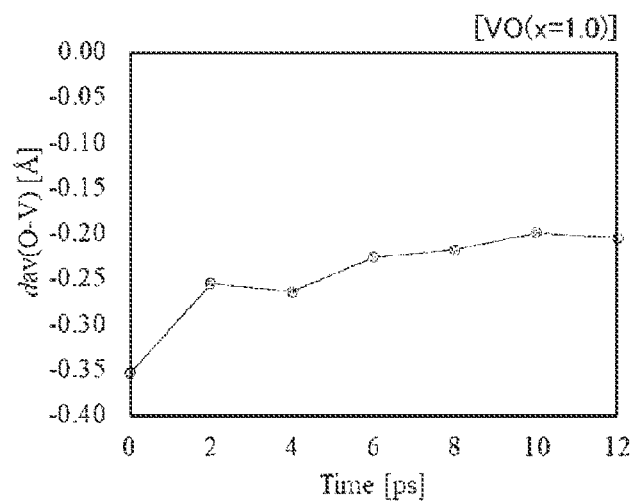
FIGS. 9A and 9B are views related to oxygen scavenging capacity in the stacked model of vanadium oxides (VO and $V_2O_3$) and tungsten.
Figure 9B:
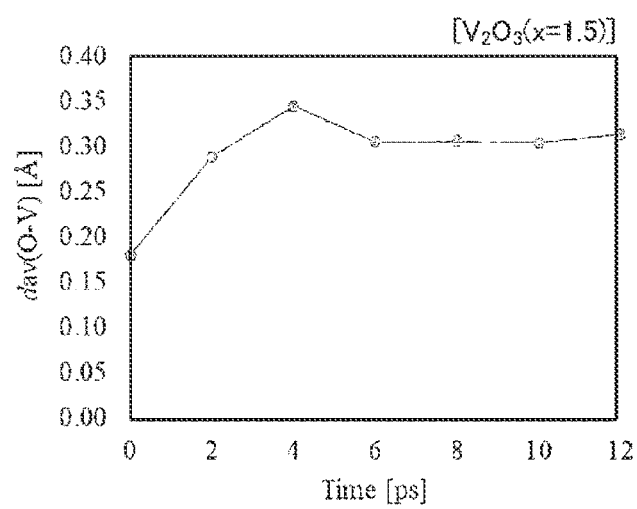
Figure 10A:
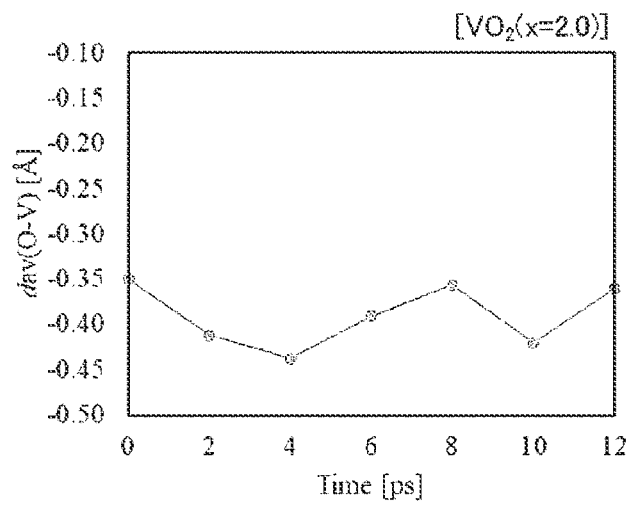
FIGS. 10A and 10B are views related to an oxygen scavenging capacity in the stacked model of vanadium oxides ($VO_2$ and $V_2O_5$) and tungsten.
Figure 10B:
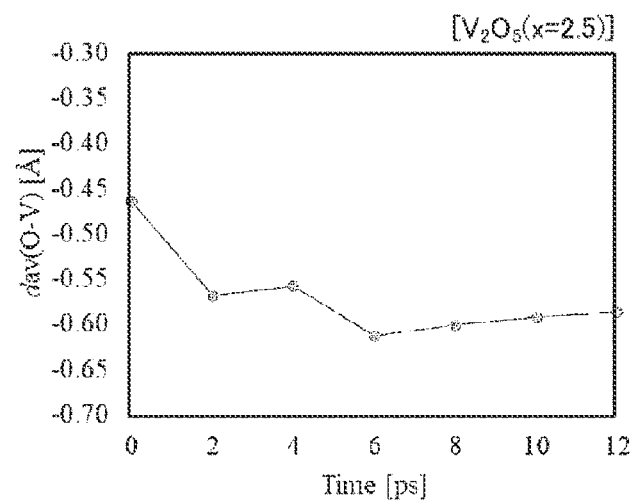
Figure 11:
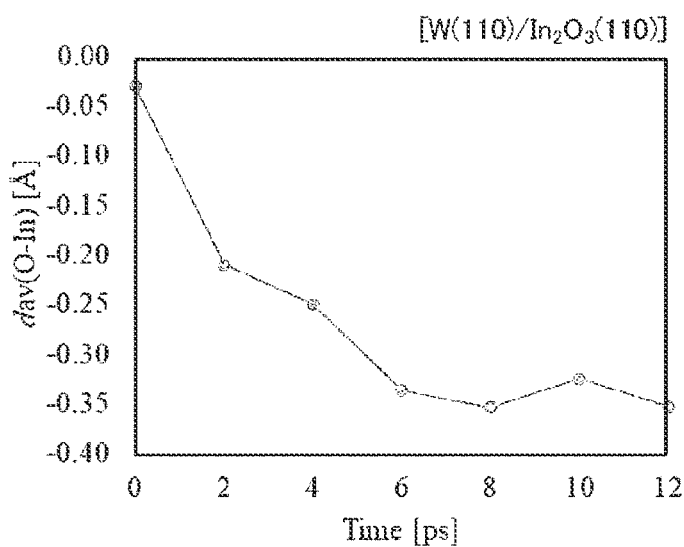
FIG. 11 is a graph related to an oxygen scavenging capacity in a stacked model of tungsten and indium oxide.

FIGS. 9A, 9B, 10A, and 10B illustrate oxygen scavenging capacities (displacement of average z coordinate/$d_{av}$(O—V)) in the stacked models (in which a lower layer is tungsten and an upper layer is $VO_x$) for vanadium oxide ($VO_x$) and tungsten. Herein, the value $d_{av}$(O—V) is evaluated with respect to a time when the stacked models are annealed at a temperature of 500 K. A tendency of decreasing $d_{av}$(O—V) over time means that oxygen of the $VO_x$ is being scavenged to the tungsten. FIGS. 9A and 9B illustrate the oxygen scavenging capacities ($d_{av}$(O—V)) in the stacked models of vanadium oxide ($VO_2$ and $V_2O_3$) and tungsten. FIGS. 10A and 10B illustrate the oxygen scavenging capacities ($d_{av}$(O—V)) in the stacked models of vanadium oxide ($VO_2$ and $V_2O_5$) and tungsten. FIG. 11 illustrates an oxygen scavenging capacity ($d_{av}$(O—In)) in a stacked model of tungsten and indium oxide ($In_2O_3$) for comparison with FIGS. 9A, 9B, 10A, and 10B. Even when oxygen in $VO_x$ is highly concentrated, the oxygen scavenging to the side of tungsten is slight as compared with $In_2O_3$, as illustrated in FIGS. 9A, 9B, 10A, and 10B. As seen from the comparison of FIG. with FIG. 11, $V_2O_5$ (that is, x=2.5) in which the oxygen concentration is high scavenges oxygen to some extent, but the amount of oxygen scavenged is small as compared with $In_2O_3$.

As described above, vanadium oxide ($VO_x$) is easily oxidized, oxygen in vanadium (V) is more stable than oxygen in tungsten (W), and vanadium oxide ($VO_x$) only slightly scavenges oxygen to the W side as compared with indium oxide ($In_2O_3$). Furthermore, when oxygen in vanadium oxide ($VO_x$) is highly concentrated, the band gap is opened. However, the energy at the bottom end of the conduction band of $VO_x$ is lower than the Fermi level of tungsten, and a tunnel barrier with respect to electrons of the tungsten side is not generated. Therefore, $VO_x$ does not contribute to an increase in on-resistance of the transistor 11. Accordingly, vanadium oxide ($VO_x$) is suitable for the constituent material for the first oxide layer 18 serving as an oxygen barrier film. Since the volume of vanadium oxide ($VO_x$) is smaller than that of wiring metal, the amount of oxygen extracted from the oxide semiconductor layer 15 can be decreased as compared with a case where vanadium oxide ($VO_x$) is not used for a barrier material.

It is preferable that vanadium oxide ($VO_x$) as the constituent material for the first oxide layer 18 have a composition represented by the following Expression (2):

$$VO_x \qquad \text{general chemical formula:}$$

wherein $0 < x \le 3.5$.

When x is greater than 3.5, the vanadium oxide is unstable, and the oxygen barrier function thereof may thus be deteriorated. To increase the oxygen barrier function and lower electrical resistance, it is preferable that x be a value of 1 or more but less than or equal to 2.5.

In the transistor 11 in an embodiment, the first oxide layer 18 is a vanadium oxide ($VO_x$: $0 < x \le 3.5$) functioning as an oxygen barrier film between the drain electrode 17 (including an oxide conductor layer) and the metal wiring layer 19. A first oxide layer 18 that contains $VO_x$ and is disposed between the drain electrode 17 and the metal wiring layer 19 can be oxidized by itself, and oxygen in $VO_x$ is stable. Therefore, the extraction of oxygen from the oxide semiconductor layer 15 (formed from IGZO or the like) by the oxidation of the metal wiring layer 19 (formed from tungsten or the like) can be reduced. The electrical resistance of the first oxide layer 18 comprising $VO_x$ can be low. Therefore, an increase in on-resistance of transistor 11 can be avoided even when the first oxide layer 18 is disposed between the drain electrode 17 and the metal wiring layer 19. Accordingly, the oxygen vacancy region can be prevented from being generated at the interface between the oxide semiconductor layer 15 and the oxide conductor layer 17.

Figure 12:
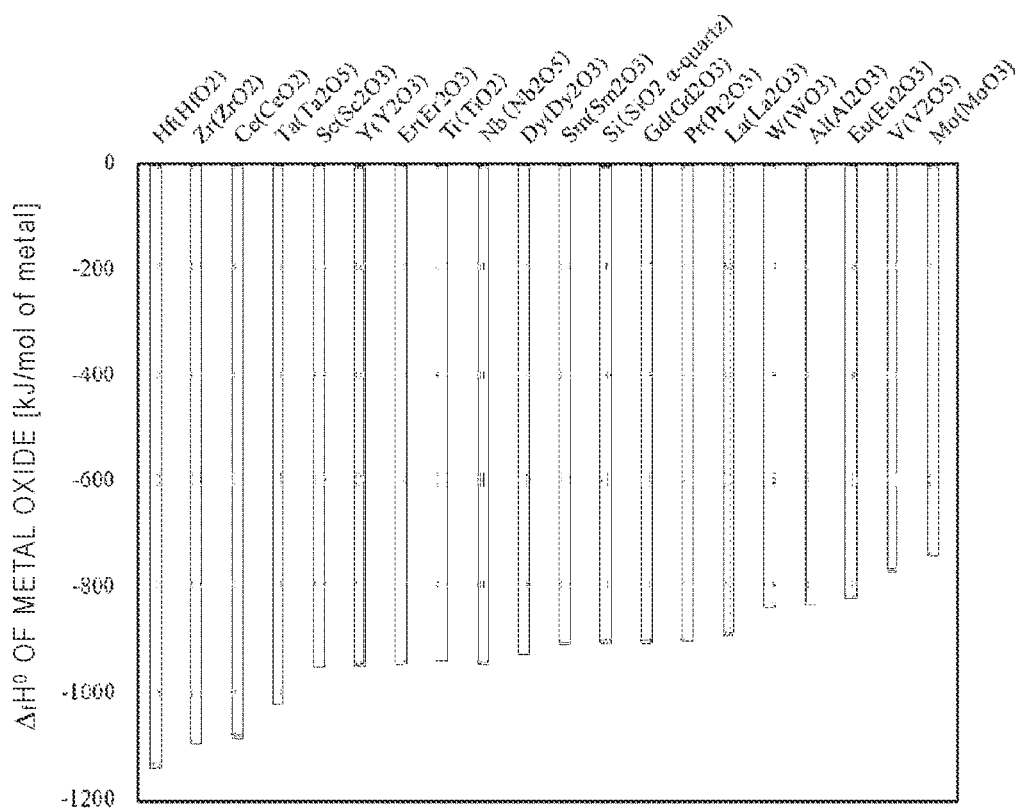
FIG. 12 is a graph illustrating values of standard enthalpy of formation of various types of metal oxides.

The first oxide layer 18 functioning as an oxygen barrier film may contain vanadium oxide ($VO_x$: $0 < x \le 3.5$) with other metal oxides. As such other metal oxides, a material that can enhance the affinity towards oxygen without affecting electron affinity is preferably used. In some examples, the other metal oxide need not necessarily have an electrical resistance as low as vanadium oxide. FIG. 12 illustrates values) ($\Delta_f H^0$) of standard enthalpy of formation of various types of metal oxides. The metals illustrated in FIG. 12 have an absolute value of standard enthalpy)($\Delta_f H^0$ of formation of oxides that is greater than or equal to vanadium. In addition to vanadium oxide ($VO_x$: $< x \le 3.5$), the first oxide layer 18 may include an oxide of at least one element selected from the group consisting of hafnium (Hf), zirconium (Zr), cerium (Ce), tantalum (Ta), scandium (Sc), yttrium (Y), erbium (Er), titanium (Ti), niobium (Nb), dysprosium (Dy), samarium (Sm), silicon (Si), gadolinium (Gd), praseodymium (Pr), lanthanum (La), tungsten (W), aluminum (Al), europium (Eu), and molybdenum (Mo).

For the metal oxide constituting the first oxide layer 18, a vanadium-containing oxide having a composition represented by the following Expression (3) is preferably used:

$$V_{1-a}M_aO_y \quad \text{general formula: (3)}$$

wherein M is an element selected from the group consisting of Hf, Zr, Ce, Ta, Sc, Y, Er, Ti, Nb, Dy, Sm, Si, Gd, Pr, La, W, Al, Eu, and Mo.

In the Expression (3), the value a satisfies $0 \leq a < 0.5$. When the value a is 0.5 or more, lower electrical resistance provided by the $VO_x$ may be deteriorated. In general, the value a is preferably 0.2 or less. The value y satisfies $0 < y \leq 3.5$, and more preferably $1 \leq y \leq 2.5$.

It is preferable that a first oxide layer 18 containing vanadium oxide having a composition satisfying the formula (3) have a thickness in a range of 0.3 nm to 5 nm. When the thickness of the first oxide layer 18 is less than 0.3 nm, the function of the oxygen barrier film may be reduced. When the thickness of the first oxide layer 18 is more than 5 nm, the amount of oxygen scavenged by the first oxide layer 18 may become too large, and the function of the oxygen barrier film may be deteriorated. It is further preferable that a first oxide layer 18 containing vanadium oxide have an amorphous structure rather than polycrystalline. The first oxide layer 18 having a polycrystal structure allows oxygen to penetrate along a grain boundary, and the oxygen barrier function may be deteriorated. In contrast, a first oxide layer 18 having a uniform amorphous structure has excellent oxygen barrier function.

Second Embodiment

Figure 13:
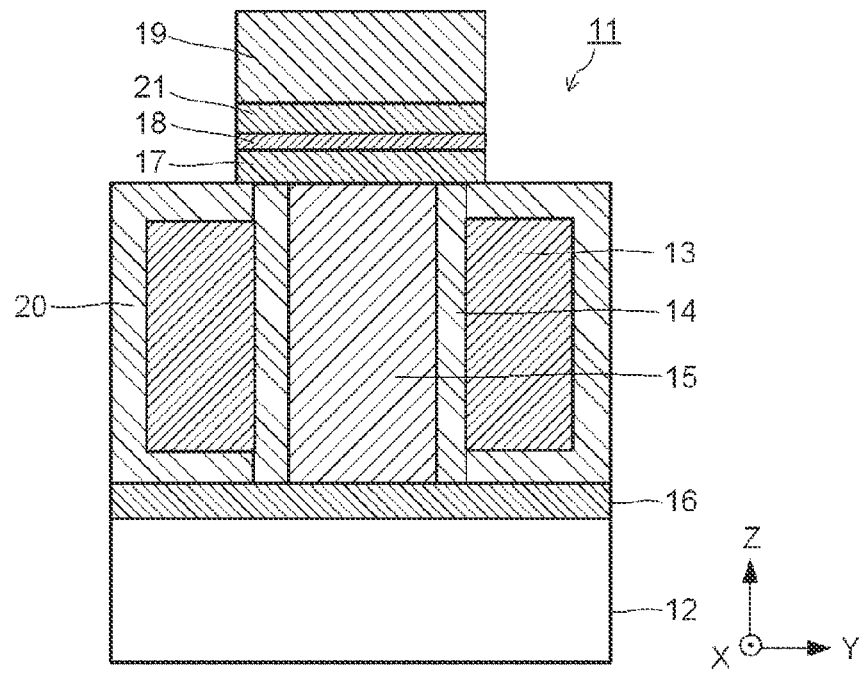
FIG. 13 is a cross-sectional view of a semiconductor device according to a second embodiment.

A semiconductor device according to a second embodiment will be described with reference to FIG. 13. FIG. 13 illustrates a transistor 11 that is a semiconductor device according to the second embodiment. The transistor 11 in FIG. 13 is a vertical transistor, like the transistor 11 in the first embodiment. Again, the transistor 11 is a SGT in which a gate electrode surrounds a channel layer. The basic configuration of the transistor 11 in the second embodiment is the same as that in the first embodiment. The transistor 11 in the second embodiment is different from the transistor 11 in the first embodiment by inclusion of a nitride layer 21 that is disposed as a barrier layer between the first oxide layer 18 and the metal wiring layer 19.

Figure 14:
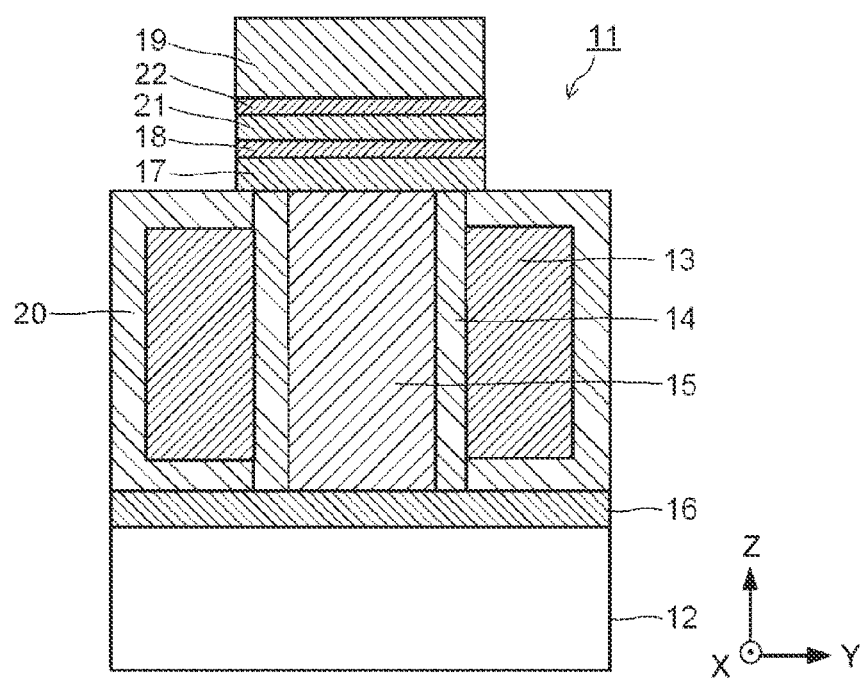
FIG. 14 is a cross-sectional view of a semiconductor device according to a modification of a second embodiment.

The barrier layer 21 is a nitride material comprising at least one material selected from titanium nitride (TiN), tungsten nitride (WN), and tantalum nitride (TaN). The barrier layer 21 prevents the bulk material of the metal wiring layer 19 formed from tungsten or the like from diffusing into the first oxide layer 18 and then the oxide conductor layer 17. When such a barrier layer 21 is added, a second oxide layer 22 may be disposed between the barrier layer 21 and the metal wiring layer 19, as illustrated in FIG. 14. For the second oxide layer 22, a vanadium-containing oxide may be used like for the first oxide layer 18. Specifically, a vanadium-containing oxide having a composition represented by the Expression (3) may be used. In this case, the value a in the Expression (3) may be in a range of 0 to 0.5.

Third Embodiment

Figure 15:
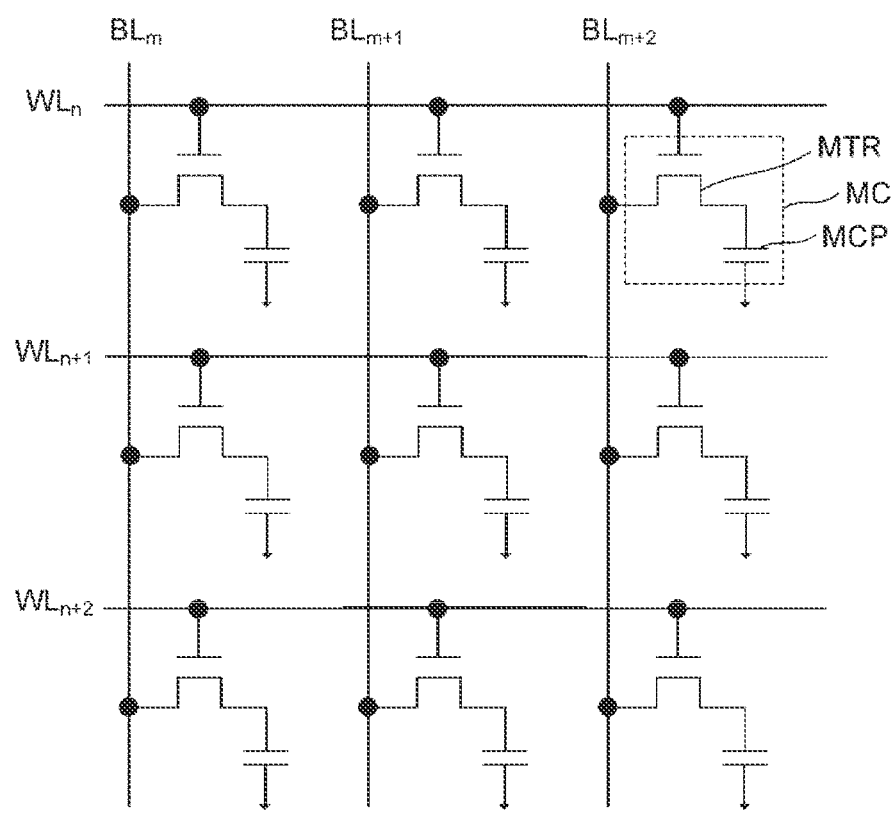
FIG. 15 is a circuit diagram of a semiconductor memory device according to a third embodiment.

FIG. 15 illustrates a semiconductor memory device according to a third embodiment. The semiconductor memory device illustrated in FIG. 15 has a plurality of memory cell. FIG. 15 is a circuit diagram illustrating a circuit configuration example of an array of the memory cells. The semiconductor memory device illustrated in FIG. 15 includes memory cells MCs, word lines WLs (a word line $WL_n$, a word line $WL_{n+1}$, a word line $WL_{n+2}$, where n is an integer), and a bit lines BLs (a bit line $BL_m$, a bit line $BL_{m+1}$, a bit line $BL_{m+2}$, where m is an integer).

The memory cells MCs are arranged in a matrix in memory cell arrays. Each of the memory cell MCs includes a memory transistor MTR (that is a field effect transistor (FET)) and a memory capacitor MCP. The memory transistor MTR can be a transistor 11 as described in the first embodiment or the second embodiment. The gate of the memory transistor MTR is connected to a corresponding word line WL, and one of the source or the drain of the memory transistor MTR is connected to a corresponding bit line BL. One electrode of the memory capacitor MCP is connected to the other of the source or the drain of the memory transistor MTR, and the other electrode of the memory capacitor MCP is connected to a power supply line for supplying a specific potential. The memory cells MCs store data by accumulating charges in the memory capacitor MCP supplied through the bit line BL according to the switching of the memory transistor MTR by the word line WL. The number of memory cells MCs is not limited to the number illustrated in FIG. 15.

The memory capacitor MCP is a three-dimensional capacitor such as a so-called pillar-type capacitor or a cylinder-type capacitor. The memory capacitor MCP includes an insulating film, a first plate electrode, and a second plate electrode. The insulating film functions as a dielectric layer of the memory capacitor MCP and is disposed between the first plate electrode and the second plate electrode. The area of the memory cells can be reduced by the use of a three-dimensional capacitor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
an oxide semiconductor layer;
an oxide conductor layer on the oxide semiconductor layer;
a first oxide layer on the oxide conductor layer and comprising vanadium oxide; and
a metal wiring layer on the first oxide layer.

2. The semiconductor device according to claim 1, wherein the vanadium oxide has a composition represented by $VO_x$, where x is a number satisfying $0 < x \leq 3.5$.

3. The semiconductor device according to claim 2, wherein x is a number satisfying $1 \leq x \leq 2.5$.

4. The semiconductor device according to claim 1, wherein the first oxide layer further includes at least one element selected from the group consisting of Hf, Zr, Ce, Ta, Sc, Y, Er, Ti, Nb, Dy, Sm, Si, Gd, Pr, La, W, Al, Eu, and Mo.

5. The semiconductor device according to claim 1, wherein the vanadium oxide has a composition represented by $V_{1-a}M_aO_y$, where M is an element selected from the group consisting of Hf, Zr, Ce, Ta, Sc, Y, Er, Ti, Nb, Dy, Sm, Si, Gd, Pr, La, W, Al, Eu, and Mo, a is a number satisfying $0 \le a < 0.5$, and y is a number satisfying $0 < y \le 3.5$.

6. The semiconductor device according to claim 5, wherein a is a number satisfying $0 < a < 0.5$.

7. The semiconductor device according to claim 5, wherein y is a number satisfying $1 \le y \le 2.5$.

8. The semiconductor device according to claim 1, wherein the first oxide layer has a thickness in a range of 0.3 nm to 5 nm.

9. The semiconductor device according to claim 1, wherein the first oxide layer has an amorphous structure.

10. The semiconductor device according to claim 1, further comprising:
a nitride layer comprising at least one material selected from the group consisting of titanium nitride, tungsten nitride, and tantalum nitride, wherein
the nitride layer is between the first oxide layer and the metal wiring layer.

11. The semiconductor device according to claim 10, further comprising:
a second oxide layer comprising vanadium oxide, wherein the second oxide layer is between the nitride layer and the metal wiring layer.

12. The semiconductor device according to claim 1, further comprising:
a gate electrode, wherein
the oxide semiconductor layer extends in a first direction, and
the gate electrode surrounds an outer circumferential surface of the oxide semiconductor layer with a gate insulating film interposed therebetween in a second direction intersecting the first direction.

13. The semiconductor device according to claim 12, wherein
the oxide semiconductor layer extends in the first direction in a cylindrical shape,
the metal wiring layer is electrically connected to a first end of the oxide semiconductor layer via the first oxide layer, and the oxide conductor, and
an electrode is electrically connected to a second end of the oxide semiconductor layer.

14. A semiconductor memory device, comprising:
a semiconductor device according to claim 13; and
a capacitor having an one end electrically connected to the metal wiring layer or the electrode.

15. A surrounding gate transistor, comprising:
an oxide semiconductor layer having a columnar shape extending in a first direction;
a gate electrode surrounding an outer peripheral surface of the oxide semiconductor layer in a second direction perpendicular to the first direction;
a gate insulating film between the gate electrode and the oxide semiconductor layer in the second direction;
a second electrode on a first end of the oxide semiconductor layer in the first direction, the second electrode including:
an oxide conductor layer at the first end of the oxide semiconductor layer,
a first oxide layer on the oxide conductor layer and comprising vanadium oxide, and
a metal wiring layer on the first oxide layer; and
a third electrode on a second end of the oxide semiconductor layer in the first direction.

16. The surrounding gate transistor according to claim 15, wherein the vanadium oxide has a composition represented by $V_{1-a}M_aO_y$, where M is an element selected from the group consisting of Hf, Zr, Ce, Ta, Sc, Y, Er, Ti, Nb, Dy, Sm, Si, Gd, Pr, La, W, Al, Eu, and Mo, a is a number satisfying $0 \le a \le 0.5$, and y is a number satisfying $0 < y \le 3.5$.

17. The surrounding gate transistor according to claim 16, wherein a is a number $0 < a < 0.5$.

18. The surrounding gate transistor according to claim 15, further comprising:
a nitride layer comprising at least one material selected from the group consisting of titanium nitride, tungsten nitride, and tantalum nitride, wherein
the nitride layer is between the first oxide layer and the metal wiring layer.

19. The surrounding gate transistor according to claim 18, further comprising:
a second oxide layer comprising vanadium oxide, wherein the second oxide layer is between the nitride layer and the metal wiring layer.

20. A semiconductor memory device, comprising:
a surrounding gate transistor according to claim 15; and
a capacitor having an one end electrically connected to the second electrode or the third electrode.

* * * * *